(12) United States Patent
Ikeda

(10) Patent No.: US 11,079,426 B2
(45) Date of Patent: Aug. 3, 2021

(54) TEST JIG FOR TESTING ELECTRICAL CHARACTERISTICS OF SEMICONDUCTOR PRODUCT

(71) Applicant: Mitsubishi Electric Corporation, Tokyo (JP)

(72) Inventor: Daisuke Ikeda, Isahaya (JP)

(73) Assignee: Mitsubishi Electric Corporation, Tokyo (JP)

( * ) Notice: Subject to any disclaimer, the term of this patent is extended or adjusted under 35 U.S.C. 154(b) by 161 days.

(21) Appl. No.: 16/290,591

(22) Filed: Mar. 1, 2019

(65) Prior Publication Data

US 2020/0081055 A1   Mar. 12, 2020

(30) Foreign Application Priority Data

Sep. 10, 2018 (JP) .............................. JP2018-168554

(51) Int. Cl.
  *G01R 31/26* (2020.01)
  *G01R 1/04* (2006.01)
  *G01R 31/28* (2006.01)

(52) U.S. Cl.
  CPC ....... *G01R 31/2601* (2013.01); *G01R 1/0416* (2013.01); *G01R 31/2853* (2013.01)

(58) Field of Classification Search
  CPC .............. G01R 1/0416; G01R 31/2601; G01R 31/2853; G01R 31/2863; G01R 31/2865; G01R 31/2887
  See application file for complete search history.

(56) References Cited

U.S. PATENT DOCUMENTS

| | | | | |
|---|---|---|---|---|
| 5,557,212 A * | 9/1996 | Isaac | ......................... | G01R 1/04 324/750.16 |
| 2008/0186046 A1* | 8/2008 | Yun | ...................... | G01R 1/0441 324/756.02 |
| 2009/0102497 A1* | 4/2009 | Ito | ...................... | G01R 31/2887 324/757.01 |
| 2014/0203829 A1* | 7/2014 | Yamada | ............. | G01R 31/2863 324/750.08 |

FOREIGN PATENT DOCUMENTS

| | | |
|---|---|---|
| JP | H05-052778 U | 7/1993 |
| JP | 2001-349926 A | 12/2001 |
| JP | 2013-242228 A | 12/2013 |

* cited by examiner

*Primary Examiner* — Son T Le
*Assistant Examiner* — Adam S Clarke
(74) *Attorney, Agent, or Firm* — Studebaker & Brackett PC

(57) ABSTRACT

A test jig for testing electrical characteristics of a semiconductor product includes a conductive ground block for supporting the semiconductor product thereon; a substrate provided on the ground block, and having a first and a second substrate electrodes formed on the substrate for the respective electrodes to be in contact with leads of the semiconductor; and lead pressers for pressing the leads against the first and the second substrate electrodes, respectively, so that electrical connection is established between the respective leads and the first and the second substrate electrodes in testing the semiconductor product.

7 Claims, 8 Drawing Sheets

TEST JIG FOR TESTING ELECTRICAL CHARACTERISTICS OF SEMICONDUCTOR PRODUCT

FIELD OF THE INVENTION

The present application relates to a test jig for testing electrical characteristics of a semiconductor product.

BACKGROUND ARTS

Conventionally, there are such patent applications as listed below disclosing test jigs for eliminating poor contact in pin connection with a multi-pin semiconductor device. JPH05-052778U discloses a test jig for pressing the pins of a semiconductor product into contact with a test board. The test jig includes such as rubber, polyimide film attached on the rubber and a metal pattern formed on the film. During the current conducting state of the semiconductor product mounted on the test jig, however, it is difficult to reduce ground inductance as small as possible and to suppress characteristic degradation due to self-generated heat of the semiconductor product because the heat is hard to sufficiently dissipate to the test jig.

Moreover, JP2001-349926A discloses a test jig that has a conductive film interposed between the ground plane of a package including a semiconductor device and that of the test jig to measure electrical characteristics of the semiconductor device with high precision and good repeatability. However, the test jig cannot measure precisely the electrical characteristic of the semiconductor device because the conductive film has a thermal resistance and an inductance and the heat is dissipated through the conductive film.

Furthermore, JP2013-242228A discloses a test jig that includes as its components, for measuring electrical characteristics of a semiconductor device, a support block for supporting the semiconductor device and an additional movable heat-dissipation block electrically connected to the support block by a conductive member, and discussing the electrical path of the test jig. Note that, the test jig is supposed to be applied to a leadless high-frequency semiconductor device.

PROBLEMS THAT THE INVENTION IS TO SOLVE

Generally, test jigs for testing electrical characteristics of a semiconductor product have a structure including a support block also serving as an electrode, a test substrate on the block, electrodes formed the substrate, and lead pressers, and use a method of establishing electrical connection by pressing the electrode terminals (hereinafter also referred to as leads) against the electrodes by the lead pressers.

However, since such a structure may form a large gap between the electrode on the substrate and the lead of the semiconductor product depending on dimensional variation of the leads, a weak pressing force of the lead pressers may cause poor contact. On the other hand, strong pressing the leads to establish a good contact state, although it brings the electrodes and the leads into contact with each other, is likely to raises a problem of deforming, such as bending, the leads.

The present application discloses a technology for solving such problems described above and aims at providing a test jig that is capable of mitigating damage to the leads of a semiconductor product in testing electrical characteristics of the semiconductor product and of measuring stably the electrical characteristics.

BRIEF SUMMARY OF THE INVENTION

A test jig for testing electrical characteristics of a semiconductor product, disclosed in the present application includes a substrate having a first substrate electrode and a second substrate electrode formed for testing a semiconductor product having leads; a conductive ground lock configured to movably support the semiconductor product and/or the substrate; lead pressers disposed so as to be movable to positions opposite to the first substrate electrode and the second substrate electrode on the substrate and configured to press the leads against the first substrate electrode and the second substrate electrode at the opposite positions, respectively, wherein electrical contact is established between the leads and the first and the second substrate electrodes to test electrical characteristics of the semiconductor product by moving to the opposite positions the ground block or the lead pressers to bring the leads into contact with the first substrate electrode and the second substrate electrode, respectively.

EFFECTS OF THE INVENTION

A test jig for testing electrical characteristics of a semiconductor product, disclosed in the present application mitigates damage to the leads of a semiconductor product in testing electrical characteristics of a semiconductor product having leads, thus being able to measure stably the electrical characteristics.

Hereinafter, test jigs for testing electrical characteristics of a semiconductor product (referred to as "electrical characteristic test jig" below) according to the present application will be described with reference to the accompanying drawings.

Embodiment 1

Figure 1:
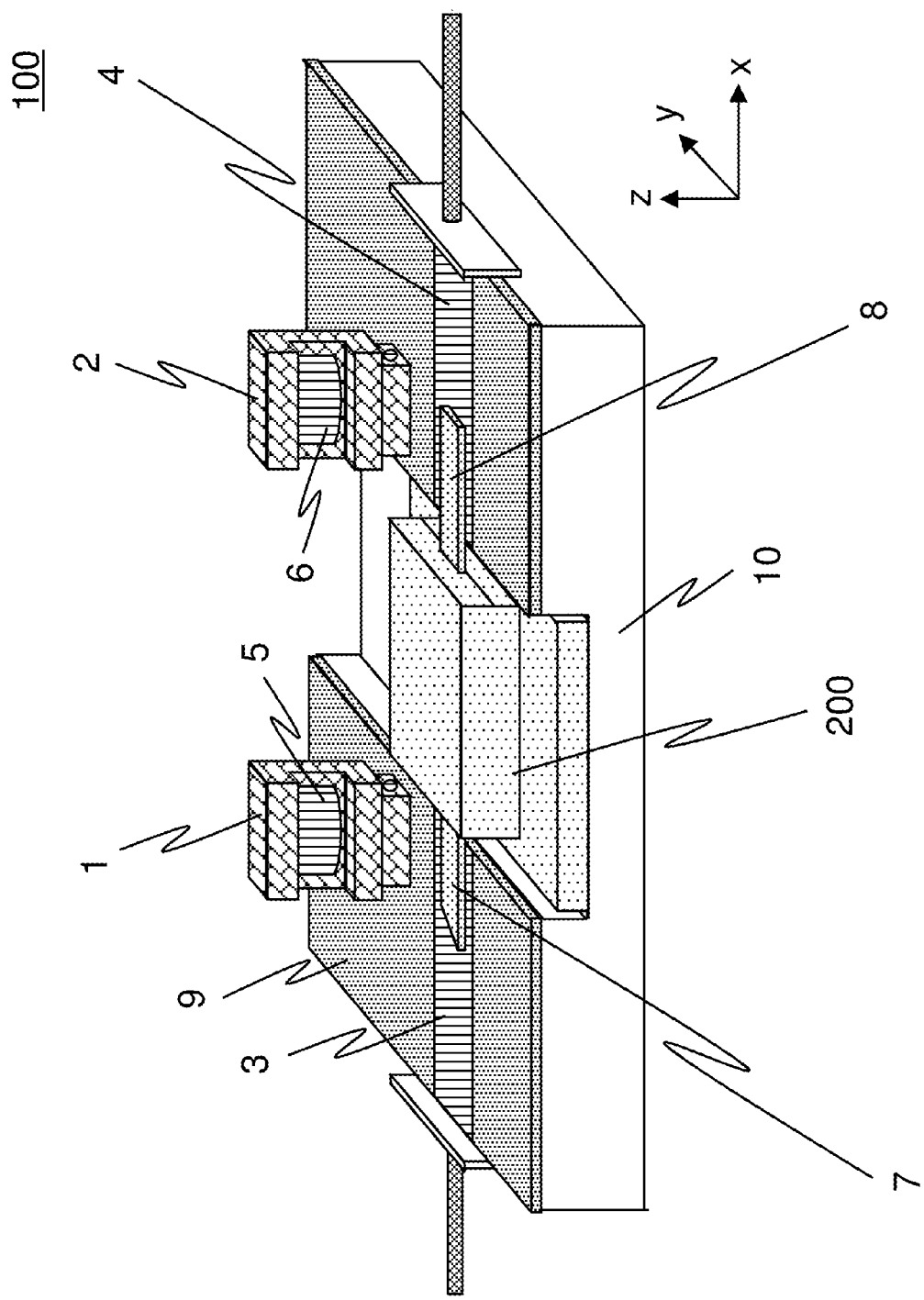
FIG. 1 is a perspective view showing an example of an electrical characteristic test jig according to Embodiment 1.

Embodiment 1 is described below with reference to FIG. 1, FIGS. 2A and 2B, and FIG. 3. FIG. 1 is a perspective view showing an example of an electrical characteristic test jig 100 according to Embodiment 1. The electrical characteristic test jig 100 includes such as lead pressers 1 and 2, a first substrate electrode 3 and a second substrate electrode 4, pressing electrodes 5 and 6, a substrate 9, and a ground block 10. The lead presser 1, 2 are components for pressing the leads 7, 8 of a semiconductor product 200 to put the leads 7, 8 into contact with the first and the second substrate electrodes 3, 4 formed on the substrate 9. Moreover, the lead pressers 1, 2 have the pressing electrodes 5, 6 for applying a test signal to the leads 7, 8 by putting them into contact with the leads 7, 8, respectively. In addition, the substrate 9 is supportedly disposed on the ground block 10.

The semiconductor product 200 is placed on the middle of the ground block 10 so that the lead 7, 8 are brought into contact with the first and the second substrate electrodes 3, 4, respectively. Note that the arrows x, y, and z in the figure indicate the longitudinal direction of, the width direction of, and the thickness direction of the substrate, respectively (the same is applies for the following figures).

Figure 2A:
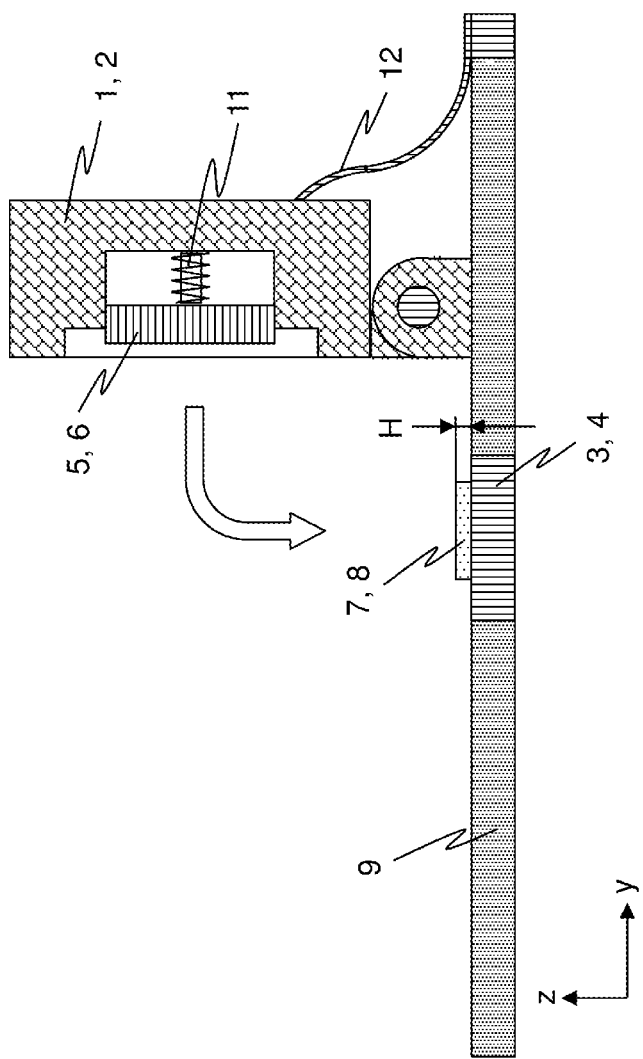
FIGS. 2A, 2B are cross-sectional views showing examples of a release state and an pressing state of main parts the electrical characteristic test jig according to Embodiment 1.
Figure 2B:
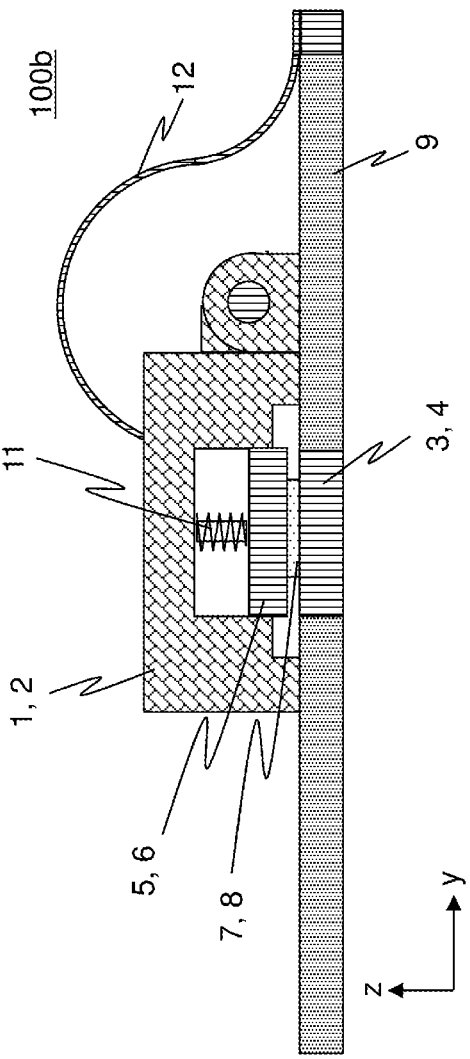

FIGS. 2A and 2B are cross-sectional views respectively showing states 100a, 100b of main parts of the electrical characteristic test jig shown in FIG. 1. These figures show cross-sections (y-z cross-sections) of the main parts except for the ground block taken along a position of each of the lead pressers 1, 2 in the direction shown by the arrow x in FIG. 1 orthogonal to the longitudinal direction of the substrate 9, in which the lead pressers 1, 2 are in release from operation (hereinafter referred to as in "release state"; see FIG. 2A) and are in operation (hereinafter referred to as in "pressing state"; see FIG. 2B).

These figures illustrate in detail an internal structure of the lead pressers 1, 2 shown in FIG. 1. The thickness H of the leads 7, 8 is shown in FIG. 2A. The hollow arrow schematically indicates movement of the lead pressers 1, 2 when they transfer from the release state to the pressing state. Note that the curved line 12 drawn out from the lead pressers 1, 2 indicates electrical wires respectively connected to the pressing electrodes 5, 6.

When the lead pressers 1, 2 operate as shown in FIG. 2B, the respective lead 7, 8 are put into a state pressed between the pressing electrodes 5, 6 and the first and the second substrate electrodes 3, 4 by spring forces of springs 11 (the springs are shorter than their natural lengths in this state) internally provided to each lead presser.

Note that in FIGS. 2A and 2B, the lead presser 1, 2 only need to press at least parts of whole lengths in the longitudinal direction of the substrate (in the x-direction orthogonal to the sheet) of the respective leads.

Figure 3:
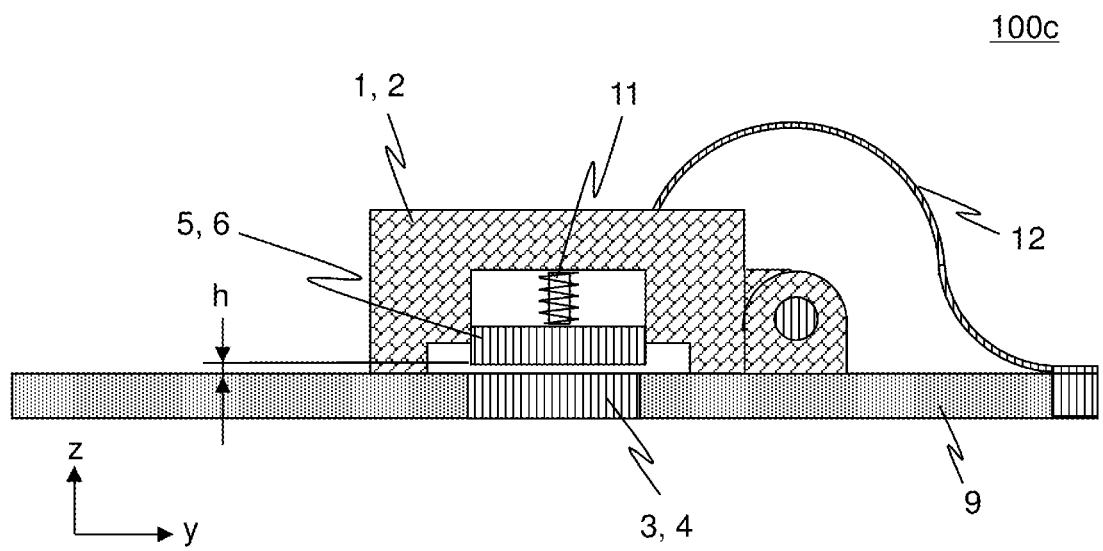
FIG. 3 is a cross-sectional view for explaining the operation of the main parts of the electrical characteristic test jig according to Embodiment 1.

FIG. 3 is a cross section for explaining an operation state 100c of the main parts of the electrical characteristic test jig shown in FIG. 1, in which a positional relationship between the pressing electrodes 5, 6 and the first and the second substrate electrodes 3, 4 formed on the substrate 9 is illustrated.

The pressing electrodes 5, 6 both are movable and respectively supported by internal springs 11 as shown in this figure. In the operation state of the lead pressers 1 and 2, the gaps h between the pressing electrode 5 and the first substrate electrode 3 and between the pressing electrode 6 and the second substrate electrode 4 are smaller than the thicknesses H of the respective leads 7, 8.

Thus, the electrical characteristic test jig has the structure such that the pressing electrodes 5, 6 are put into contact with and press the leads 7, 8 against the first and the second substrate electrodes 3, 4 in the pressing states of the lead pressers 1 and 2. This structure allows the test signal to be applied from either pair of electrodes, i.e., the pair of pressing electrode 5 and first substrate electrode 3 and the pair of pressing electrode 6 and first substrate electrode 4, in other words, from either substrate electrode and either pressing electrode.

While the test signal can be applied, as described above, from either electrode of the four electrodes of the pressing electrode 5, the pressing electrode 6, the first substrate electrode 3, and the second substrate electrodes 4, a large gap between the first substrate electrode 3 and the lead 7 and/or between the first substrate electrode 4 and the lead 8 owing to variations in thickness of the leads 7, 8 and in height attached to the semiconductor product may result in that the leads 7, 8 are brought into no contact with the first and the second substrate electrode 3, 4.

Therefore, even when the lead 7 is in no contact with the first substrate electrode 3, the test can be performed if the lead 7 is in contact with the pressing electrodes 5 and the lead 8 is in contact with the second substrate electrode 4 and/or with the pressing electrode 6; similarly, even when the lead 8 is in no contact with the first substrate electrode 4, the test can be performed if the lead 8 is in contact with the pressing electrodes 6 and the lead 7 is in contact with the first substrate electrode 3 and/or with the pressing electrode 5. This eliminates the need to apply to the leads 7, 8 such an excessive pressing force as to deform the leads 7, 8 in order to put them into contact with the first and the second substrate electrodes 3, 4, thus mitigate state variation in contact between the leads and the respective corresponding pairs of electrodes.

Embodiment 2

Figure 4:
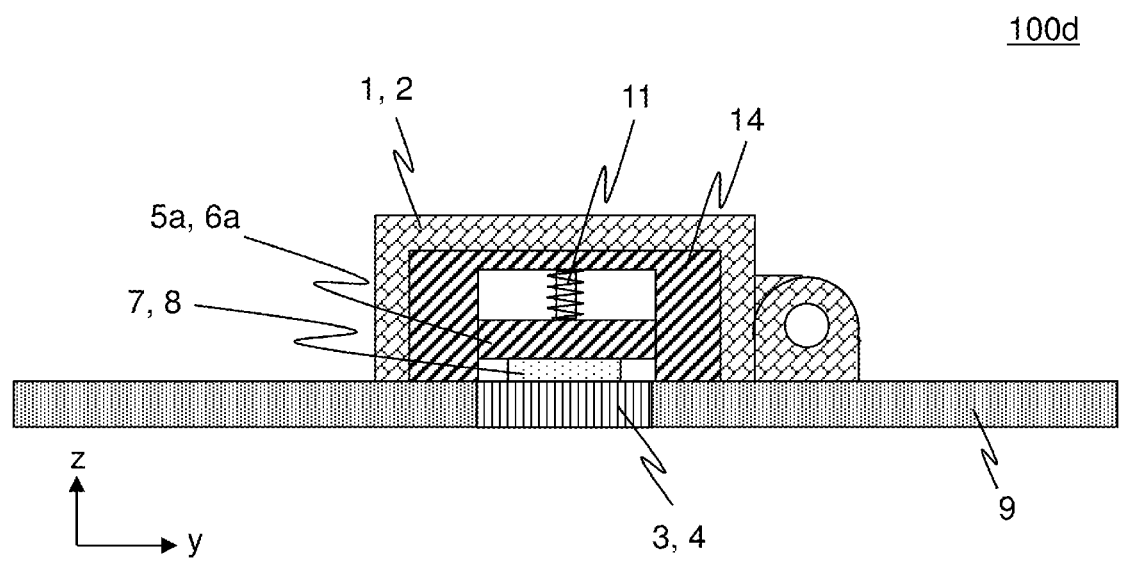
FIG. 4 is a cross-sectional view showing an example of main parts of an electrical characteristic test jig according to Embodiment 2.

An example of an electrical characteristic test jig according to Embodiment 2 is described below with reference to FIG. 4. FIG. 4 is a cross-sectional view of a pressing state 100d of main parts of the electrical characteristic test jig, in which the lead pressers 1, 2 are altered from those shown in FIG. 3 such that they have the pressing electrodes 5a, 6a are formed of a dielectric material and a dielectric enclosure 14 is internally provided to the lead pressers 1, 2, for covering above and around these electrodes 5a, 6a. Note that, the structure other than described above is the same as that shown in FIG. 3. FIG. 4 is a cross-sectional view of a pressing state 100d of main parts of the electrical characteristic test jig, in which the pressing electrodes 5, 6 shown in FIG. 3 are altered to pressing electrodes 5a, 6a formed of a dielectric material and a dielectric enclosure 14 is provided for covering above and around these electrodes 5a, 6a. Note that, the structure other than described above is the same as that shown in FIG. 3.

Using a dielectric material for the pressing electrode 5a, 6a and the enclosure 14 renders the whole structure of the lead pressers like a coaxial cable when the lead pressers 1, 2 are in the pressing state.

As described above, employing the electrical characteristic test jig having a structure like a coaxial cable suppresses change in condition of the electrical path by covering the leads 7, 8 with the lead pressers, thus bringing about an advantage in precision in testing a high-frequency semiconductor device.

Embodiment 3

Figure 5:
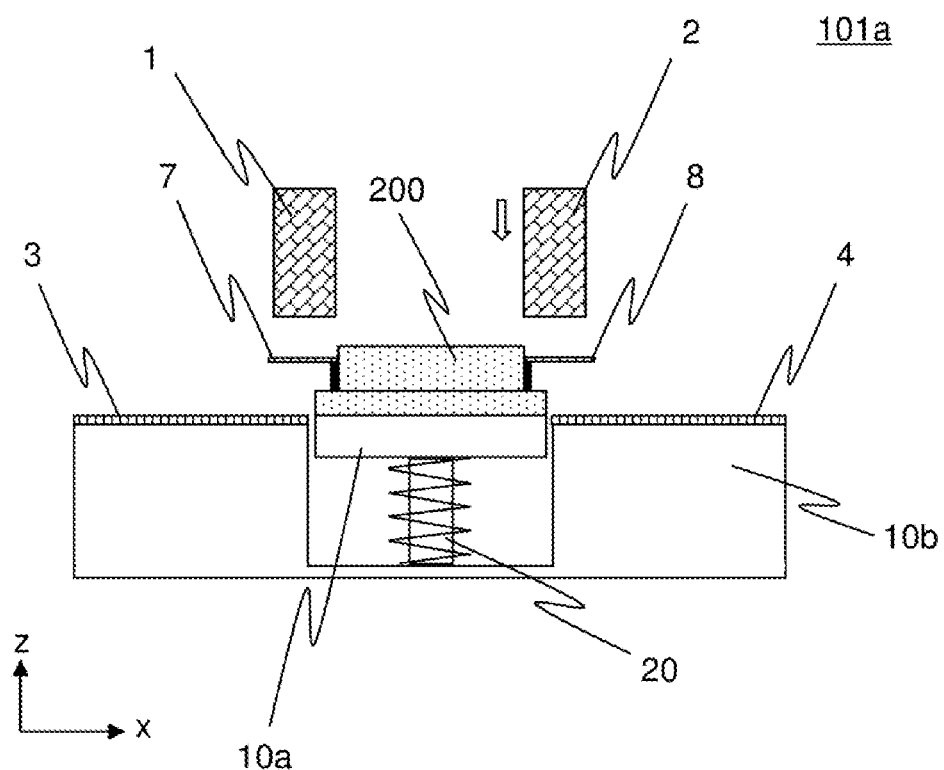
FIG. 5 is a cross-sectional view for explaining a release state of an electrical characteristic test jig according to Embodiment 3.

An electrical characteristic test jig according to Embodiment 3 is described below with reference to FIG. 5 and FIG. 6. FIG. 5 is a cross-sectional view (x-z cross section) showing a release state 101a of the electrical characteristic test jig of Embodiment 3. The lead pressers 1, 2 each are altered to have a shape that covers the whole length from top to root of the leads 7, 8 in the longitudinal direction of the substrate, which direction is indicated by the arrow x in the figure (see FIG. 1), and a ground block 10a for mounting the semiconductor product 200 is provided with a movable part 20, so that the leads 7, 8 are movable vertically. Note that the hollow arrow in FIG. 5 schematically indicates movement of the lead presser 2, and the lead presser 1 also moves similarly. In addition, the structure other than described above is the same as that of the electrical characteristic test jig of Embodiment 1; hence its description is omitted.

Figure 6:
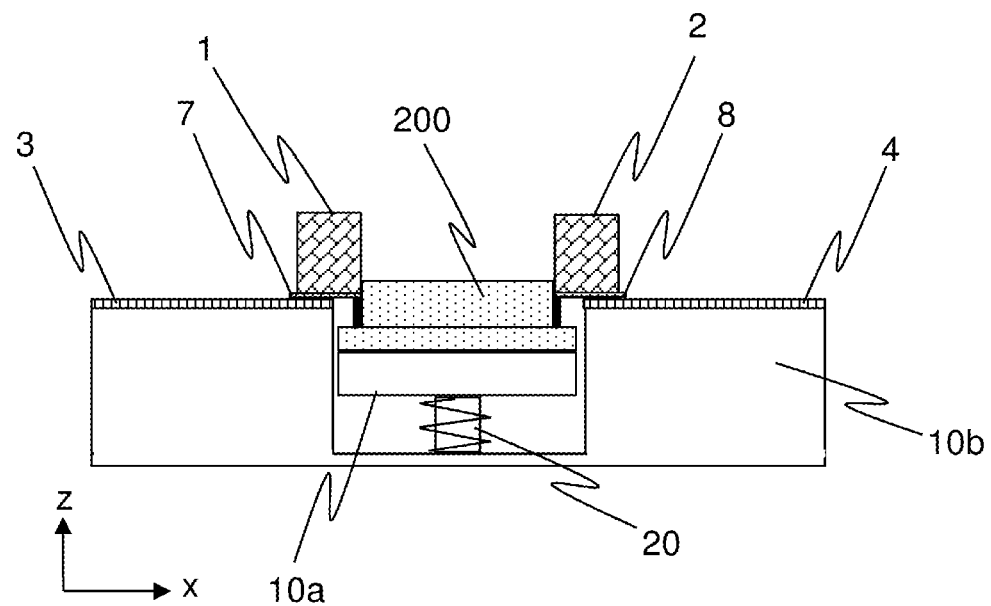
FIG. 6 is a cross-sectional view for explaining a pressing state of the electrical characteristic test jig according to Embodiment 3.

The lead pressers 1, 2 each coveringly press the whole length from top to root of the leads 7, 8 of the semiconductor product and thereby move down the ground block 10a, so that the leads 7, 8 are brought into contact with the first and the second substrate electrodes 3, 4 on the ground block 10b as shown by a pressing state 101b of the electrical characteristic test jig in FIG. 6, thus enabling the semiconductor product to come into in the state for the test signal to be applied.

Since the movable motion of the ground block 10a at pressing the leads 7, 8 allows the contact surfaces of the leads 7, 8 of the semiconductor product to be adjusted in height to the first and the second substrate electrodes 3, 4, respectively, the leads 7, 8 can be put into contact with the first and the second substrate electrodes 3, 4 without deformed even if the leads 7, 8 vary in thickness and/or in height attached to the semiconductor product, thus being able to mitigate variation of the contact states.

Embodiment 4

Figure 7:
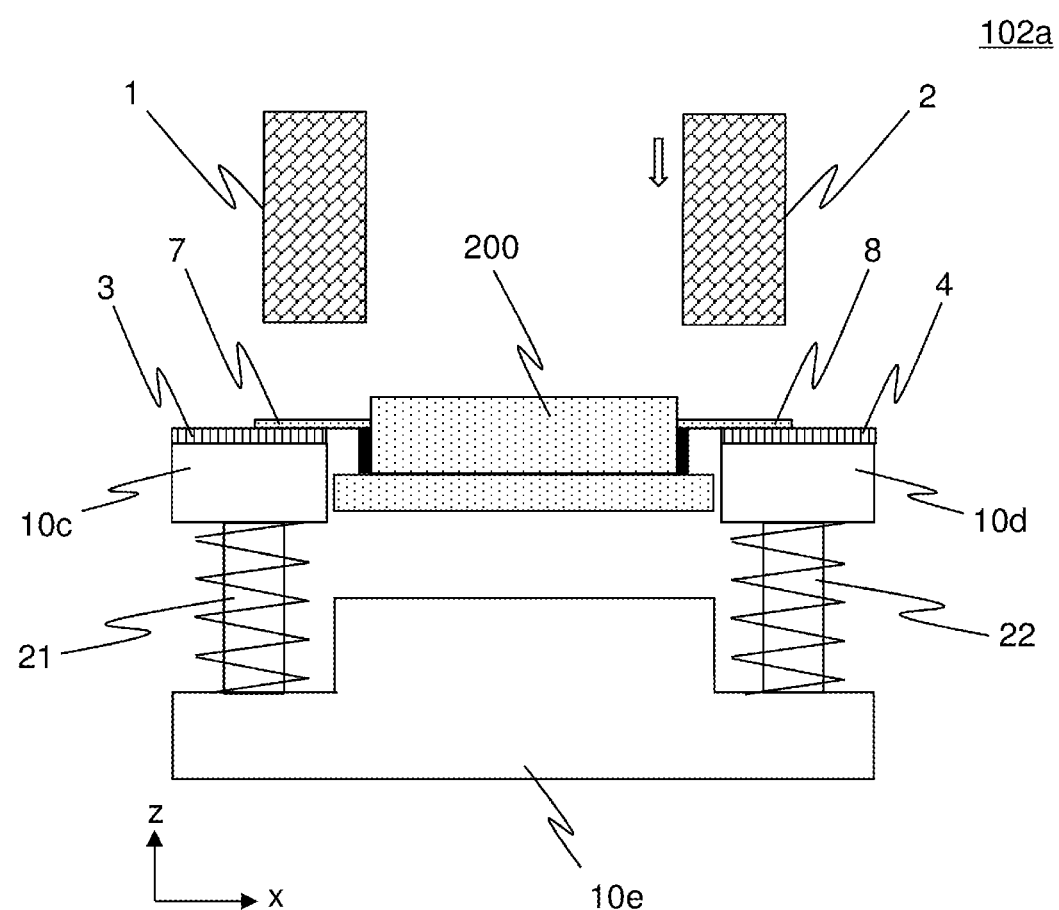
FIG. 7 is a cross-sectional view for explaining a release state of an electrical characteristic test jig according to Embodiment 4.

Embodiment 4 is described below with reference to FIG. 7 and FIG. 8. FIG. 7 is a cross-sectional view (x-z cross section) showing a release state 102a of an electrical characteristic test jig according to Embodiment 4. The electrical characteristic test jig shown in this figure is provided with movable parts 21, 22 below ground blocks 10c, 10d, respectively, instead of the movable part of the ground block 10a shown in FIG. 5 so that the first substrate electrodes 3, 4 on the ground blocks 10c, 10d can be moved vertically in the figure. Note that the hollow arrow in FIG. 7 schematically indicates movement of the lead presser 2, and the lead presser 1 also moves similarly. In addition, the structure other than described above is the same as that of the electrical characteristic test jig of Embodiment 3; hence its description is omitted.

Figure 8:
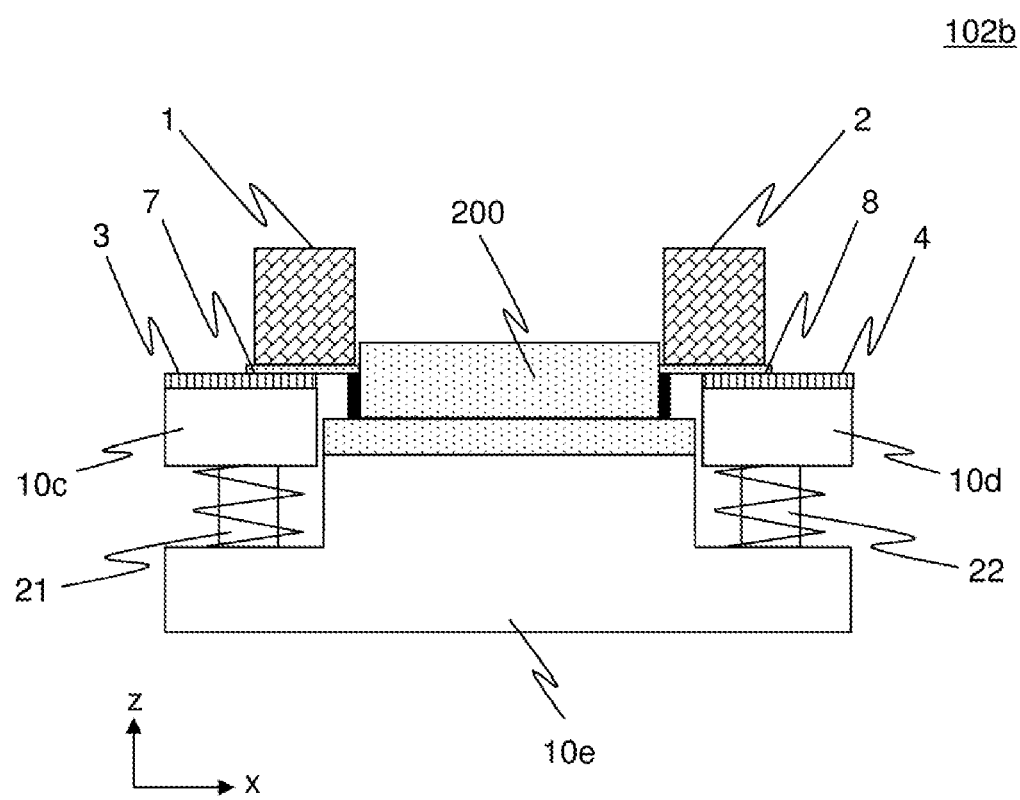
FIG. 8 is a cross-sectional view for explaining of a pressing state of the electrical characteristic test jig according to Embodiment 4.

The lead pressers 1, 2 each coveringly press the whole length from top to root of the respective leads 7, 8 of the semiconductor product and thereby move down the first and the second substrate electrodes 3, 4, so that the semiconductor product 200 is brought into contact with a ground block 10e as shown by a pressing state 102b of the electrical characteristic test jig in FIG. 8, thus enabling the semiconductor product to come into in the state for the test signal to be applied.

Since the movable motions of the first and the second substrate electrodes 3, 4 at pressing the leads 7, 8 allow the substrate electrodes to be adjusted in height to the leads 7, 8 of the semiconductor product, respectively, the leads 7, 8 can be put into contact with the first and the second substrate electrodes 3, 4 without deformed even if the leads 7, 8 vary in thickness and/or in height attached to the semiconductor product.

Thus, the variation of contact state can be mitigated in either variation case of the leads. Moreover, the ground block 10e is made larger and fixed compared to Embodiment 3, thereby improving ability of dissipating heat generated in the semiconductor product.

Embodiment 5

Figure 9:
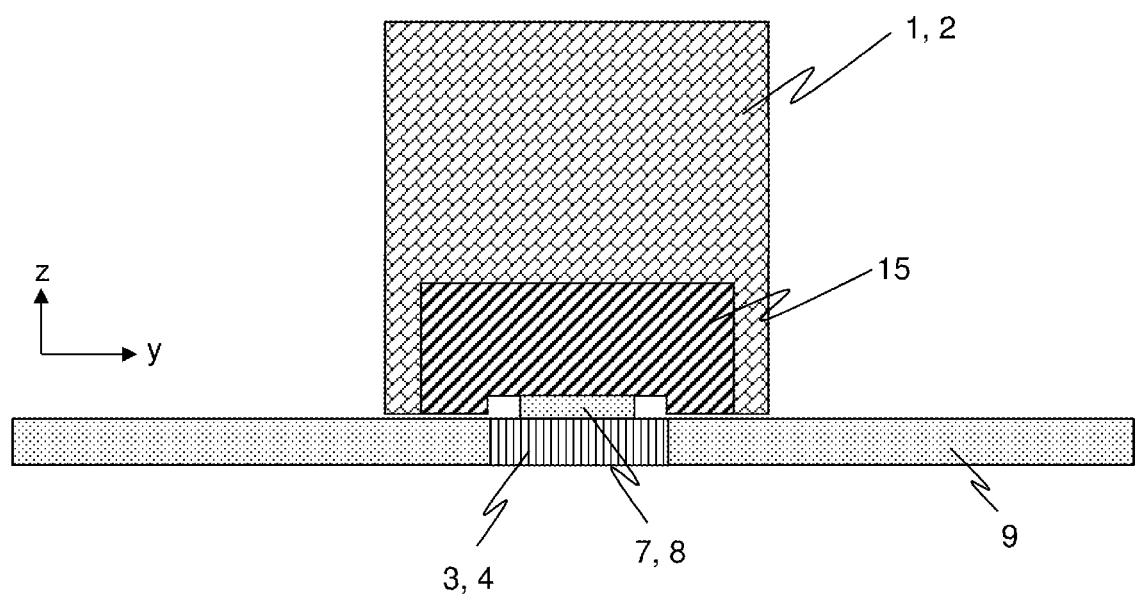
FIG. 9 is a cross-sectional view for explaining an example of a pressing state of main parts of an electrical characteristic test jig according to Embodiment 5.

Embodiment 5 is described below with reference to FIG. 9. FIG. 9 is a cross section showing a pressing state 101c of main parts of an electrical characteristic test jig according to Embodiment 5. The electrical characteristic test jig shown in FIG. 9 is structured such that the lead pressers 1, 2 shown in FIG. 5 each have a dielectric enclosure 15 for covering above and around the leads 7, 8. As shown in the figure, enclosure 15 is formed in contact with each upper surface of the leads 7, 8. Note that the structure other than described above is the same as that of the electrical characteristic test jig of Embodiment 3; hence its description is omitted.

Using a dielectric material for the enclosure 15 of the lead pressers 1, 2 renders the pressing structure like a coaxial cable when the lead pressers 1, 2 press the leads 7, 8. Enclosing the leads 7, 8 in this way suppresses change in condition of the electrical path for the semiconductor product, thus bringing about an advantage in accuracy in measurement of a high-frequency semiconductor device.

While the present application describes various exemplars of the embodiments and the examples, it is understood that the various features, aspects and functionality described in one or more of the embodiments are not limited in applicability to the particular embodiment but can be applied alone or in various combinations to the embodiments; therefore, numerous examples other than those exemplified in the present application are conceivable without departing from the technological scope of the present application. For example, at least one of the constituents may be modified, added, or omitted, and further at least one of the constituents may be selected and combined with those in the other embodiment.

REFERENCE NUMERALS 1, 2: read presser;
3: first substrate electrode;
4: second substrate electrode;
5, 6: pressing electrode;
5a, 6a: dielectric pressing electrode;
7, 8: lead;
9: substrate;
10, 10a, 10b, 10c, 10d, 10e: ground block;
11: spring;
12: curved line;
14, 15: enclosure;
20, 21, 22: movable part;
100: electrical characteristic test jig;
100a, 101a, 102a: release state of electrical characteristic test jig;
100b, 100d, 101b, 101c, 102b: pressing state of electrical characteristic test jig;

100c: operation state of electrical characteristic test jig; and
200: semiconductor product.

What is claimed is:

1. A test jig for testing electrical characteristics of a semiconductor product, comprising:
   a substrate having a first substrate electrode and a second substrate electrode formed for testing a semiconductor product having leads;
   a conductive ground block configured to movably support the semiconductor product and/or the substrate;
   lead pressers disposed so as to be movable to positions opposite to the first substrate electrode and the second substrate electrode on the substrate and configured to press the leads against the first substrate electrode and the second substrate electrode at the opposite positions, respectively, and the lead pressers each have a spring-supported pressing electrode changeable in position, wherein
   electrical contact is established between the leads and the first and the second substrate electrodes to test electrical characteristics of the semiconductor product by moving to the opposite positions the ground block or the lead pressers to bring the leads into contact with the first substrate electrode and the second substrate electrode, respectively.

2. The test jig for testing electrical characteristics of a semiconductor product, of claim 1, wherein the pressing electrode is a conductive pressing electrode changeable in position.

3. The test jig for testing electrical characteristics of a semiconductor product, of claim 1, wherein the lead pressers each have a dielectric enclosure internally provided to the lead pressers, for covering the pressing electrodes.

4. The test jig for testing electrical characteristics of a semiconductor product, of claim 2, wherein the ground block is provided movably in the thickness direction of the substrate, and the lead pressers each press a whole length from top to root of the leads in the longitudinal direction of the substrate, to test the electrical characteristics of the semiconductor product.

5. The test jig for testing electrical characteristics of a semiconductor product, of claim 3, wherein the ground block is provided movably in the thickness direction of the substrate, and the lead pressers each press a whole length from top to root of the leads in the longitudinal direction of the substrate, to test the electrical characteristics of the semiconductor product.

6. The test jig for testing electrical characteristics of a semiconductor product, of claim 4, wherein the lead pressers each have a dielectric enclosure internally provided to the lead pressers, for cover above and around the leads.

7. The test jig for testing electrical characteristics of a semiconductor product, of claim 1, wherein the ground block is translationally movable in a thickness direction of the substrate, and the lead pressers are pivotally movable to the opposite positions or translationally movable in the thickness direction of the substrate.

* * * * *